(12) United States Patent
Song et al.

(10) Patent No.: US 6,229,179 B1
(45) Date of Patent: May 8, 2001

(54) INTELLIGENT POWER INTEGRATED CIRCUIT

(75) Inventors: Chang-Sub Song, Seoul; Hyeong-Woo Jang, Bucheon; Sin-Kook Jang, Incheon, all of (KR)

(73) Assignee: Fairchild Korea Semiconductor Ltd. (KR)

( * ) Notice: Subject to any disclaimer, the term of this patent is extended or adjusted under 35 U.S.C. 154(b) by 0 days.

(21) Appl. No.: 09/421,292

(22) Filed: Oct. 20, 1999

(30) Foreign Application Priority Data

Oct. 29, 1998 (KR) .................................. 98-45733

(51) Int. Cl.[7] .......................... H01L 27/01; H01L 27/12; H01L 31/0392; H01L 29/76; H01L 29/94
(52) U.S. Cl. .......................... 257/350; 257/347; 257/370; 257/329; 257/335
(58) Field of Search .................................. 257/347, 350, 257/370, 329, 335

(56) References Cited

U.S. PATENT DOCUMENTS

| | | | |
|---|---|---|---|
| 5,258,318 | * 11/1993 | Buti et al. | 437/34 |
| 5,294,823 | * 3/1994 | Eklund et al. | 257/370 |
| 5,371,401 | * 12/1994 | Kurita | 257/524 |
| 5,396,087 | * 3/1995 | Baliga | 257/139 |
| 5,466,969 | * 11/1995 | Tsunoda | 257/706 |
| 5,740,099 | * 4/1998 | Tanigawa | 357/351 |
| 5,985,708 | * 11/1999 | Nakagawa et al. | 257/341 |

OTHER PUBLICATIONS

"Partially Bonded SOI Substrates for Intelligent Power Ics", Kikuchi et al., ICSSDM 1995, pp. 848–850.

* cited by examiner

*Primary Examiner*—Eddie C. Lee
*Assistant Examiner*—Jesse A. Fenty
(74) *Attorney, Agent, or Firm*—Rothwell, Figg, Ernst & Manbeck

(57) ABSTRACT

A semiconductor device, more particularly, an intelligent power integrated circuit formed on a substrate where a power device and a control device are formed is provided. The intelligent power integrated circuit includes a handling substrate for a first conductivity type, a substrate for a power device of a second conductivity type where a first buffer layer of a concentration higher than that of the substrate for the power device is formed around a surface contacting with the handling substrate, a substrate for a control device formed on an insulating layer partially formed on the substrate for the power device, a control device formed on the substrate for the control device, and a power device vertically formed through the substrate for the power device and the handling substrate.

24 Claims, 6 Drawing Sheets

INTELLIGENT POWER INTEGRATED CIRCUIT

BACKGROUND OF THE INVENTION

1. Field of the Invention

The present invention relates to a semiconductor device and a method for manufacturing the same, and more particularly, to an intelligent power integrated circuit having a power device and a control device formed on the same substrate, and to a method for manufacturing the same.

2. Description of the Related Art

An intelligent power integrated circuit having a vertical double diffusion MOS (VDMOS) as an output device, in which a power device and a control device controlling the same are formed on the same substrate, is used for an application for controlling solenoid. The power integrated circuit usually employs the SOI structure to electrically insulate the power device from the control device. However, a buried oxide layer should be partially formed such that drain current of the VDMOS can vertically flow, so that it is difficult to manufacture the SOI structure.

Much research for realizing an intelligent power integrated circuit is currently being conducted. Here, silicon direct bonding technology by which the intelligent power integrated circuit having partially bonded SOI substrates can be obtained will be described (from "Partially Bonded SOI Substrates for Intelligent Power Ies", Solid State Device and Materials, 1995, pp. 848–850, Hiroaki Kikuchi and Kenichi Arai).

FIGS. 1A through 1E are sectional views for illustrating a method for manufacturing a conventional intelligent power integrated circuit forming a power device and a control device on the same substrate.

A buried oxide layer 12 is formed in a control device portion of a first wafer 10 of N$^-$-type in a trench, as illustrated in FIG. 1A, formed by etching which is etched with an HF solution until a recess portion 14 of approximately 0.1 μm is formed (FIG. 1B).

Subsequently, the first wafer 10 having the recess portion 14 and a second wafer 16 of N$^+$-type are processed in a SCI solution to remove impurity particles from a bonding surface. During the above process, native oxides layer formed on the two wafers strengthen the bonding strength, so that the bond does not separate. Then, the first wafer 10 having the recess portion 14 and the second wafer 16 are bonded at a room temperature. Subsequently, an annealing process is performed to strengthen the bonding strength of the bonded wafers. As a result, a gap G is formed between the buried oxide layer 12 and the second wafer 16 of N$^+$-type(FIG. 1C).

Then, the first wafer 10 of N$^-$-type is polished to form an active layer. At this time, the thickness of the active layer, which is the thickness of the polished first wafer, is chosen to achieve a desired breakdown voltage between a source of a VDMOS and a drain thereof to be formed (FIG. 1D). Subsequently, a control device is formed in an active layer (a control device portion) on the buried oxide layer 12 and the gap G, and the VDMOS of a power device is formed in other regions, i.e., a power device portion (FIG. 1E).

The method for manufacturing an intelligent power integrated circuit IC using the above-described direct bonding technology is for manufacturing the SOI substrate partially formed on the second wafer 16 of N$^+$-type of a high concentration. At this time, the control device is formed on the SOI structure, and a power device of VDMOS is formed in a region other than the SOI structure. That is, the buried oxide layer is partially formed on the first wafer, which is bonded to the second wafer using the silicon direct technology, to thereby easily manufacture the intelligent power integrated circuit in which the VDMOS of the power device and the control device are formed on the same wafer, i.e., on the second wafer 16 of N$^+$-type.

SUMMARY OF THE INVENTION

It is an objective of the present invention to provide an intelligent power integrated circuit in which an insulated gate bipolar transistor having a low on-state voltage drop low $R_{ds}$(on) and a rapid switching characteristic and a control device controlling the same are formed on the same substrate.

It is another objective of the present invention to provide a method for manufacturing the intelligent power integrated circuit.

Accordingly, to achieve the first objective, an intelligent power integrated circuit according to the present invention includes a handling substrate of a first conductivity type having a second buffer layer of a concentration which is higher than that of the handling substrate around the surface of the handling substrate contacting the substrate for a power device, a substrate for a power device of a second conductivity type where a first buffer layer of a concentration higher than that of the handling substrate is formed around a surface contacting with the handling substrate, a substrate for a control device formed on an insulating layer partially formed on the substrate for a power device, a control device formed on the substrate for a control device, a power device such as an insulated gate bipolar transistor (IGBT) vertically formed through the substrate for a power device and the handling substrate, and an insulating wall for preventing a power device formed on the substrate for a power device from being electrically connected to a control device formed in the substrate for a control device formed on the side wall of the substrate for a control device formed on an insulating layer partially formed on the substrate for a power device.

The handling substrate is a substrate doped with a high concentration P$^-$-type impurity, and the substrate for a power device is a substrate doped with a low concentration N-type impurity, and the first buffer layer is a layer in which an N$^-$-type impurity is doped with a concentration higher than that of the substrate for a power device, and the second buffer layer is a layer in which a P-type impurity is doped with a concentration higher than that of the handling substrate.

To achieve the second objective, a method for manufacturing an intelligent power integrated circuit according to one embodiment of the present invention includes the steps of: (a) bonding a substrate for a power device of a second conductivity type on a surface, of which a first buffer layer is formed, to a handling substrate of a first conductivity type, such that the first buffer layer contacts with the handling substrate, and then annealing the bonded substrate at approximately 1,150° C. to increase the bonding strength; (b) controlling the thickness of the substrate for a power device according to a desired breakdown voltage of a power device to be formed by etching such as wrapping or chemical mechanical polishing, and then forming an insulating layer as thick as electrical separation between the substrate for a power device and a substrate for a control device to be formed e.g., 1 μm~3 μm; (c) bonding a substrate for a control device on the insulating layer, and then annealing the bonded substrate at 1,100° C. to increase the bonding strength between the substrate for a control device and the insulating layer; (d) etching the substrate for a control device and the insulating layer stacked in the power device portion to thereby leave a pattern where the substrate for a control device and the insulating layer are stacked in the control device portion; and (e) forming a control device in the substrate for a control device, and a power device such as an insulated gate bipolar transistor (IGBT) in a substrate for a power device exposed by etching of step (d).

The handling substrate having a surface on which a second buffer layer is formed, is formed by steps of providing a handling substrate having the crystallization direction of (100) and a resistivity of 0.01 Ω-cm in the CZ manner, injecting boron(B) ions with a dose of $1 \times 10^{15} \sim 5 \times 10^{15}$ ion/cm$^2$, and annealing the handling substrate where ions are injected at approximately 1,150° C. to form the second buffer layer, and the substrate for a power device having a surface on which a first buffer layer is formed, is formed by steps of providing a substrate for a power device having the crystallization direction of (100) and a resistivity of 60~100 Ω-cm in the FZ manner, injecting phosphorus (P) ions with a dose of $1 \times 10^{15} \sim 3 \times 10^{15}$ ion/cm$^2$, and annealing the substrate for a power device to which ions are injected at approximately 1,150° C. to form the first buffer layer.

A bipolar transistor or an MOS transistor is formed as the control device, and when the bipolar transistor is formed as the control device, a step of forming a buried layer of a high concentration in a region of the substrate for a control device where a bipolar transistor is to be formed, after step (b) is provided.

To achieve the first object, an intelligent power integrated circuit according to another embodiment of the present invention includes: a handling substrate of a first conductivity type having a second buffer layer of concentration higher than that of other portions; a substrate for a power device of a second conductivity type where a first buffer layer of a concentration higher than that of the handling substrate around the surface contacting with the handling substrate, formed on the handling substrate; a substrate for a control device formed on an insulating layer formed on a control device portion of the substrate for a power device; an epitaxial layer formed on the power device portion of the substrate for a power device, electrically isolated from the substrate for a control device by an isolation layer; and a control device formed on the substrate for a control device and a power device vertically formed through the epitaxial layer, the substrate for a power device and the handling substrate.

The handling substrate is a substrate doped with a P-type impurity of a high concentration, the substrate for a power device is a substrate doped with an N-type impurity having a low concentration, the first buffer layer is a layer doped with an impurity having a concentration higher than that of the substrate for a power device, and the second buffer layer is a layer doped with an impurity of a P-type having a concentration higher than that of the handling substrate, and the substrate for a control device is doped with an impurity of the first conductivity or the second conductivity type.

To achieve the second object, a method for manufacturing an intelligent power integrated circuit according to another embodiment of the present invention includes the steps of: (a) bonding a substrate for a power device of a second conductivity type on a surface of which a first buffer layer is formed with a handling substrate to contact the handling substrate with the first buffer layer, on the handling substrate of a first conductivity type having a surface where a second buffer layer is formed; (b) controlling the thickness of the substrate for a power device according to a desired breakdown voltage of a power device to be formed by etching such as wrapping or chemical mechanical polishing, and then forming an insulating layer, and then forming an insulating layer on the substrate for a power device; (c) bonding a substrate for a control device on the insulating layer; (d) etching the substrate for a control device and the insulating layer stacked in the power device portion to leave a pattern stacked a control device and the insulating layer in a control device portion; (e) forming an epitaxial layer on the substrate for a power device, and then forming a trench between the structure where the insulating layer and the substrate for a control device are stacked and the epitaxial layer, and filling the trench with an insulating material to thereby form an isolation layer electrically separating the substrate for a control device and the epitaxial layer; and (f) forming a control device on the substrate for a control device, and a power device on the epitaxial layer.

The handling substrate is formed in CZ manner, the substrate for a power device is formed in an FZ manner, and the substrate for a control device is formed in the FZ manner.

In order to form the bipolar transistor formed as the control device, at the method further comprises the step of forming a buried layer of a high concentration in the surface of the substrate for a control device, in which the bipolar transistor is to be formed, after step (b).

The epitaxial layer formed on the resultant substrate where the substrate for a control device is formed by epitaxial technology is etched until a surface of the substrate for a control device is exposed, to planarize a surface thereof.

Thus, according to the present invention, an insulated gate bipolar transistor having a low on-state voltage drop (low R $_{ds}$(on)) and a rapid switching characteristic and a control device controlling the same can be formed on the same substrate, to thereby reduce power consumption of a device and thus enhance performance of a device.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1A:
FIGS. 1A through 1E are sectional views illustrating a method for manufacturing a conventional intelligent power integrated circuit in which a power device and a control device are formed on the same substrate.
Figure 1B:
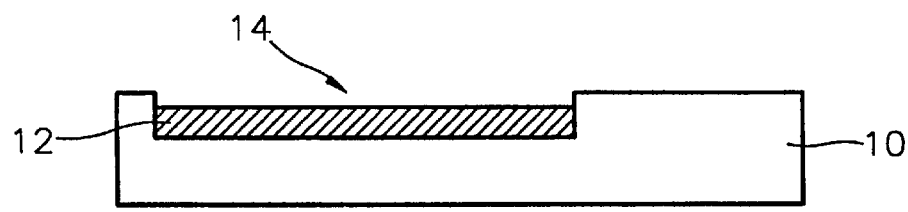
Figure 1C:
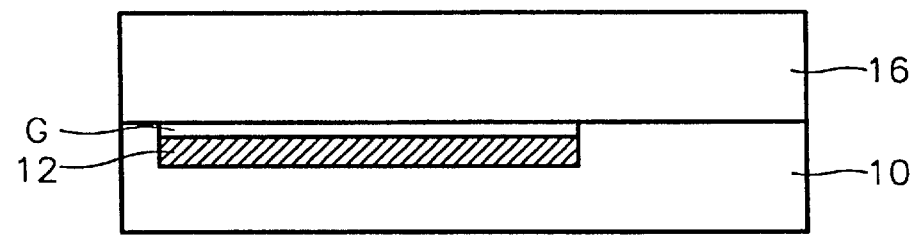
Figure 1D:
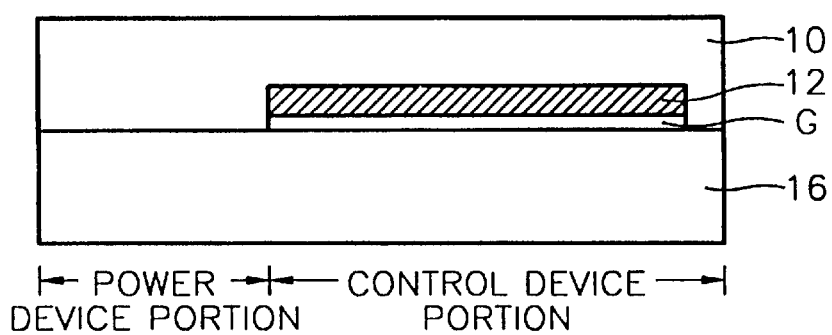
Figure 1E:
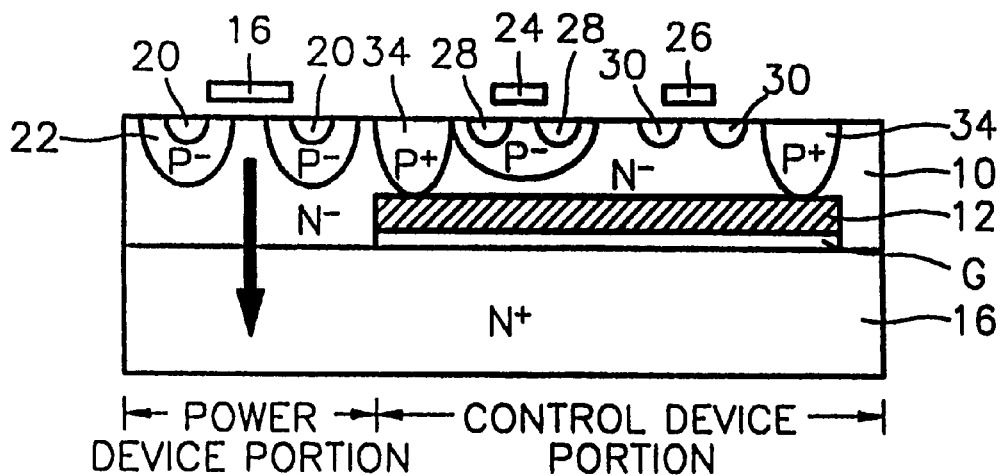

Hereinafter, an intelligent power integrated circuit according to the present invention and a method for manufacturing the same will be described more in detail, with reference to the attached drawings. In the drawings, like numbers refer to like elements throughout.

Embodiment 1

Figure 2:
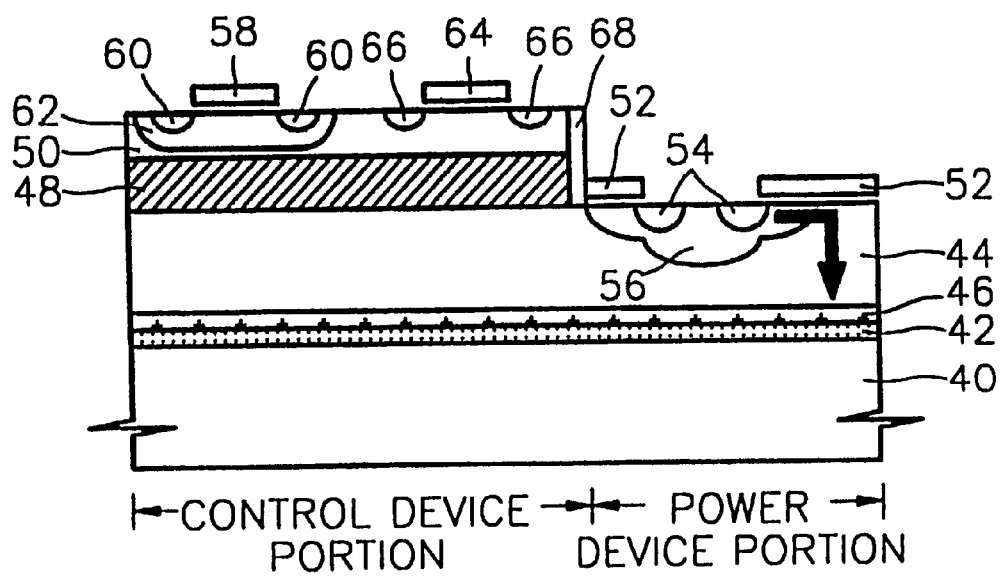
FIG. 2 is a sectional view partially showing an intelligent power integrated circuit according to an embodiment the present invention in which a power device and a control device are formed on the same substrate.

FIG. 2 shows an intelligent power integrated circuit in which an insulated gate bipolar transistor (IGBT) power device and a control device controlling the IGBT power device are formed on the same substrate.

In FIG. 2, a reference numeral 40 indicates a $P^+$-type handling substrate, a reference numeral 42 indicates a $P^{++}$-type second buffer layer, a reference numeral 44 indicates a $N^-$-type substrate for power device, a reference numeral 46 indicates a substrate for an $N^-$-type power device, a reference numeral 48 indicates an insulating layer, a reference numeral 50 indicates a substrate for a P-type control device, a reference numeral 52 indicates a gate for IGBT, a reference numeral 54 indicates an $N^+$-type source, a reference numeral 56 indicates $P^-$-type body region, a reference numeral 58 indicates a PMOS gate for a control device, a reference numeral 60 indicates P+ source and drain, a reference numeral 62 indicates an N-well, a reference numeral 64 indicates an NMOS gate for a control device, a reference numeral 66 indicates $N^+$-type source and drain, and a reference numeral 68 indicates an insulation wall.

The control is formed on the substrate 50 for a control device bonded on the insulating layer 48, and an insulated gate bipolar transistor (IGBT) power device is vertically formed through the substrate 44 for a power device and the handling substrate 40 bonded by the silicon direct bonding technology. The control device and the power device, which are formed on the handling substrate 40, are electrically isolated from each other by the insulating layer 48. That is, the control device is formed on the SOI substrate, to thereby electrically isolate from the substrate 44 for a power device. At this time, the insulating layer 48 and the substrate 50 for a control device are formed only in the control device portion, so that the control device portion protrudes comparison with the power device portion.

The $N^+$-type first buffer 46 is formed around the surface of the substrate 44 for a power device, where the surface is bonded to the substrate 40 for a handle. Also, the $P^{++}$-type second buffer layer 42 is formed around the surface of the handling substrate 40, where the surface is bonded to the substrate 44 for a power device. The impurity concentration of the $N^+$-type first buffer layer 46 is higher than the impurity concentration of the substrate 44 for a power device, and the impurity concentration of the second $P^{++}$-type buffer layer 42 is higher than the impurity concentration of the handling substrate 40. Here, $P^+$-type indicates the highly doped $P^-$-type impurity, $P^{++}$-type indicates the impurity of $P^-$-type doped with the concentration higher than that of $P^+$-type, $N^-$-type means a lightly-doped impurity of $N^-$-type, and $N^+$-type indicates the impurity doped with the concentration higher than that of the N−, which are within the scope understood by a person skilled in the art.

Also, even if the device is manufactured with substrates and buffer layers having conductivities which are different from the above-described conductivities, the objects and effect of the present invention are not changed. At this time, when the handling substrate 40 has conductivity of P-type, the conductivity of the second buffer layer 42 also requires P-type, and the substrate 44 for a power device and the first buffer layer 46 requires N-type. However, the substrate 50 for a control device has the conductivity type determined by electric operation of the control device, regardless of the conductivity type of the handling substrate 40 and the substrate 44 for a power device. That is, in FIG. 2, the conductivity type of the substrate 50 for a control device may be P-type or N-type. However, according to one embodiment of the present invention, the conductivity type of the substrate 50 for a control device is P-type.

The first buffer layer 46 can increase the switching speed of an IGBT power device and emit electron radiation or proton radiation for controlling a carrier lifetime of IGBT, and the second buffer layer 42 maintains the low on-state voltage drop (low $R_{ds}$(on)).

The substrate 50 for a control device and the substrate 44 for a power device are separated from each other by the insulating layer 48; however, in a region where the control device portion contacts the power device portion, a control device formed on the substrate 50 for a control device may be electrically connected to a power device formed on the substrate 44 for a power device. Thus, the insulating wall 68 is formed on the sidewall of the substrate 50 for a control device, to electrically separate the power device from the control device.

In the intelligent power integrated circuit according to one embodiment of the present invention, an IGBT power device is formed in a power device portion, and a bipolar transistor and/or a MOS transistor (only the MOS transistor is shown in FIG. 2) are formed in the control device portion in accordance with the function of the control device portion.

Thus, the buffer layers are formed for the IGBT device having characteristics of low on-state voltage drop and the high switching speed, so that power consumption due to the switching loss and the conduction loss can be minimized, to thereby maximize performance of the intelligent power integrated circuit.

FIGS. 3A through 3G are sectional views illustrating a method for manufacturing the intelligent power integrated circuit of FIG. 2 using the silicon direct bonding technology.

Figure 3A:
FIGS. 3A through 3G are sectional views illustrating a method for manufacturing the intelligent power integrated circuit of FIG. 2 using the silicon direct bonding technology.

Referring to FIG. 3A, a $P^+$-type wafer of high concentration having the crystallization direction of (100) and resistivity of 0.01 Ω-cm is provided as a handling substrate 40. Boron ions are injected into the surface of the handling substrate 40 with a dose of $1\times10^{15}$ ion/cm²~$5\times10^{15}$ ion/cm², and then the ions are diffused by annealing at approximately 1,150° C., to thereby form a $P^{++}$-type second buffer layer 42 having the concentration higher than that of the handling substrate 40 is formed around the surface of the handling substrate 40. At this time, the second buffer layer 42 is formed to 5~6 μm.

Figure 3B:
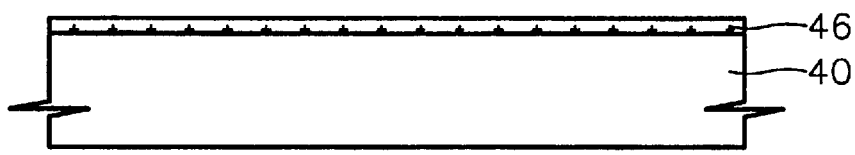

Referring to FIG. 3B, a $N^-$-type wafer of a low concentration having the crystallization direction of (100) and the resistivity of 60~100 Ω-cm is provided in a flat zone (FT) manner on a substrate 44 for a power device. Subsequently, Phosphorus ions re injected into the surface of the substrate 44 for a power device with a dose of $1.5\times10^{15}$ ion/cm²~$3\times10^{15}$ ion/cm², and then the ions are diffused by annealing at approximately 1,150° C., to thereby form a $N^+$-type first buffer layer 46 having the concentration higher than that of the substrate 44 for a power device around the surface of the substrate 44 for a power device.

Figure 3C:
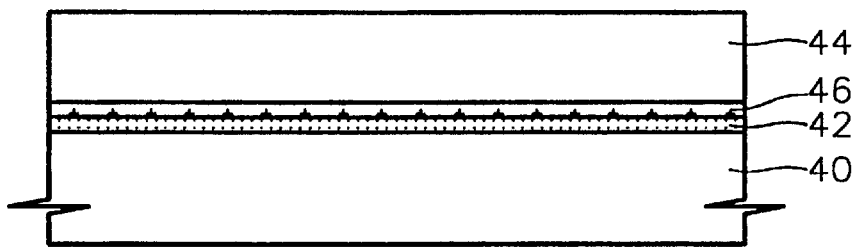

Referring to FIG. 3C, the surfaces of the handling substrate 40 and the substrate 44 for a power device are cleaned with SCI+100:1 for bonding, and then the two substrates are bonded in the vacuum state. At this time, the bonding is performed in the silicon direct bonding (SDB) manner. Then, the substrates bonded at approximately 1,150° C. are annealed to increase the bonding strength between the two substrates. At this time, the second buffer layer 41 formed on the surface of the handling substrate 40 contacts the first buffer layer 46 formed on the surface of the substrate 44 for a power device.

Subsequently, the thickness of the substrate 44 for a power device is controlled using lapping or chemical mechanical polishing (CMP). At this time, the thickness of the substrate 44 for a power device is controlled corresponding to a voltage required by the power device portion. The thickness of the substrate 44 for a power device usually depends on a breakdown voltage of the device, so that the thickness is controlled to correspond to a desired breakdown voltage of the power device, e.g., to approximately 50~150 $\mu$m.

Figure 3D:
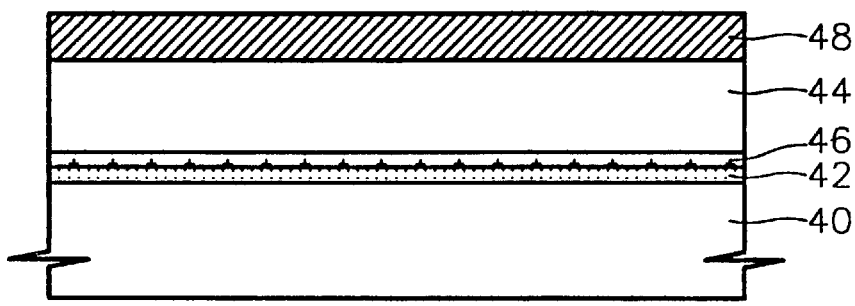

Referring to FIG. 3D, an insulating layer 48, e.g. an oxide layer, is formed on the substrate 44 for a power device having the appropriately controlled thickness. At this time, the insulating layer 48 is formed to the thickness in which electric separation between the substrate 44 for a power device and the substrate (see 50 of FIG. 3E) for a control device to be bonded can be sufficiently performed, e.g., 1~3 $\mu$m.

Figure 3E:
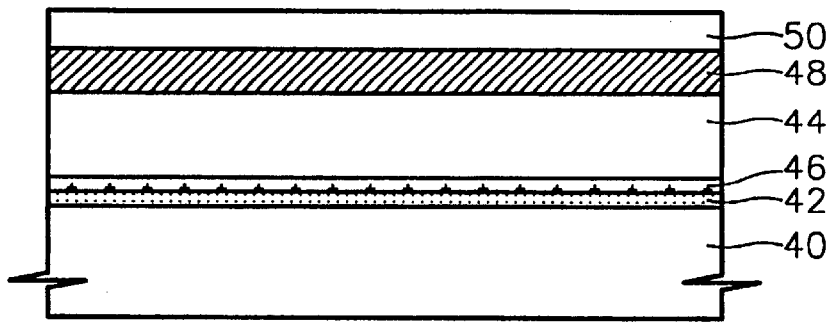

Referring to FIG. 3E, the substrate 50 for a control device required for manufacturing the control device is bonded onto the resultant structure where the insulating layer 48 is formed. At this time, the substrate 50 for a control device is wafer having the resistivity of 1~100 $\Omega$-cm manufactured in the FZ manner. After the bonding, the bonded substrate is annealed at approximately 1,100° C. or more, to increase the bonding strength between the insulating layer 48 and the substrate 50 for a control device. Then, the substrate 50 for a control device is controlled to the thickness required for manufacturing the control device, e.g., 1,000 Å~10 $\mu$m. At this time, the thickness of the substrate 50 for a control device is controlled by the above-described lapping or CMP method.

Figure 3F:
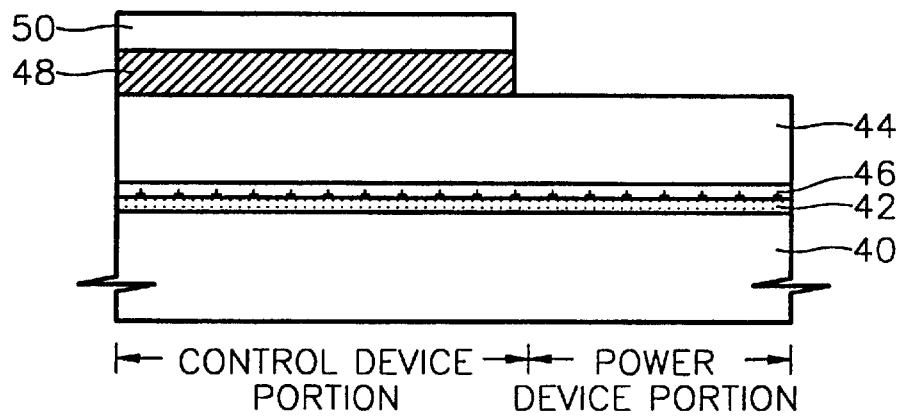

Referring to FIG. 3F, an oxide layer as an etching mask layer (not shown) is formed on the substrate 50 for a control device, and then an etching mask pattern (not shown) is formed only on the substrate 50 for a control device of the control device portion by patterning. Then, the substrate 50 for a control device of the power device portion exposed through a process in which the mask pattern is used as a mask is etched, so that the substrate 50 for a control device remains only in the control device portion. The insulating layer 48 of the power device portion is etched through a process in which the etching mask pattern is used as a mask. At this time, when materials for the etching mask layer is the same as that for the insulating layer, e.g., the two materials are oxide layers, the etching mask pattern formed on the control device portion is removed during the process of etching the insulating layer of the power device portion.

As a result of the process, the substrate 50 for the control device and the insulating layer 48 are stacked only in the control device portion and protrude, to thereby open, i.e. expose, the substrate 44 for the power device of the power device portion.

Figure 3G:
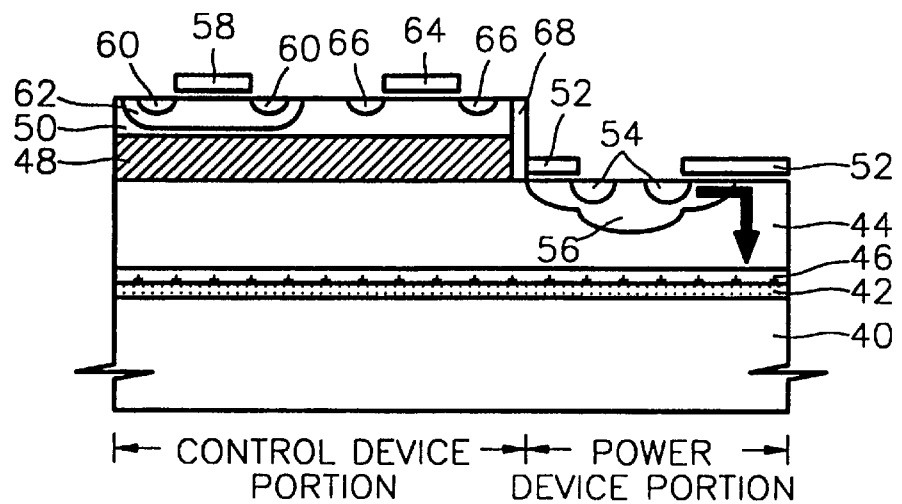

Referring to FIG. 3G, the insulating wall 68 for separating devices to be formed on the substrate 50 for a control device and the substrate 44 for a power device is formed on the sidewalls of the protruding substrate 50 for a control device and the insulating layer 48; and control devices such as a bipolar transistor and/or an MOS transistor are formed on the substrate 50 for a control device; and a power device such as an insulated gate bipolar transistor (IGBT) is formed on the substrate 44 for a power device.

At this time, when the bipolar transistor is formed as the control device, the process of partially forming a buried layer (not shown) corresponding to a region in which the bipolar transistor is to be formed, around the surface of the bonding portion, before bonding the substrate 50 for a control device to the insulating layer 48, is added. The buried layer of the high concentration is formed to the depth of approximately 1 $\mu$m by injecting an impurity with a dose of $1 \times 10^{15}$ ion/cm$^2$~$8 \times 10^{15}$ ion/cm$^2$ into the substrate 50 for a control device, and then annealing at approximately 1,000° C.

By the method for manufacturing one embodiment of the present invention, electric isolation between the power device portion and the control device portion is completed, and the power device portion can be formed using the IGBT. That is, the power device portion can be realized by the IGBT of the DMOS structure vertically formed on the N$^+$-type first buffer layer 46 of high concentration and the P$^{++}$-type second buffer layer 42 of high concentration, so that the low on-state voltage drop and the switching time of high speed can be realized without radiating electrons or protons. Thus, the power consumption caused by the conduction loss and the switching loss can be minimized, to thereby maximize performance of the intelligent power integrated circuit. Also, a step difference between the substrate 50 for a control device and the substrate 44 for a power substrate can be used as an alignment key so that the control device portion and the power device portion can be defined by self-alignment to thereby simply form the pattern.

Embodiment 2

Figure 4:
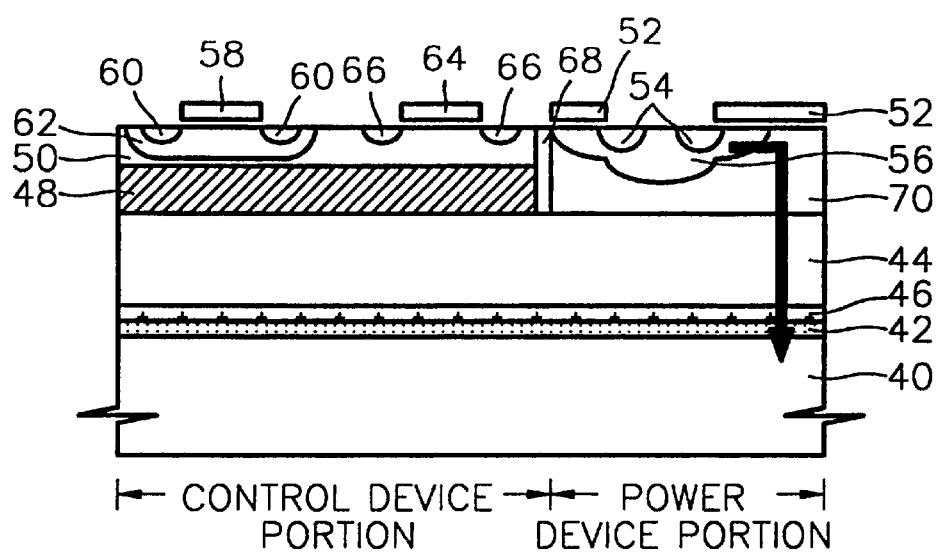
FIG. 4 is a sectional view partially showing an intelligent power integrated circuit according to another embodiment of the present invention in which a power device and a control device are formed on the same structure.

Referring to FIG. 4, an epitaxial layer 70 is formed on the substrate 44 for a power device, to remove a step difference between the control device portion and the power device portion.

The control device is formed on the substrate 50 for a control device in the control device portion, and the power device is formed on the epitaxial layer on the substrate 44 for a power device. The control device portion and the power device portion are electrically separated from each other by the insulation wall 68 formed therebetween.

In the above first embodiment, the control device and the power device are manufactured using the step difference therebetween as an alignment key; however, in the second embodiment, the step difference between two regions is removed to solve various problems generated from the region where the control device contacts the power device during the process of manufacturing the control device and the power device.

Figure 5A:
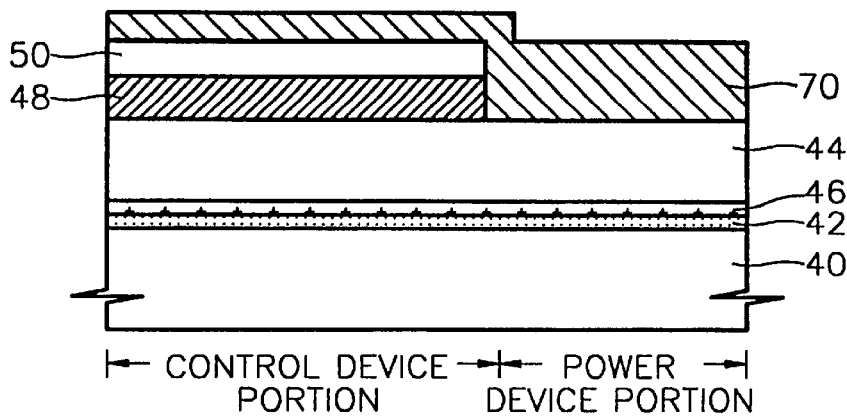
FIGS. 5A through 5C are sectional views showing a method for manufacturing the intelligent power integrated circuit of FIG. 4 using the silicon direct bonding technology.
Figure 5B:
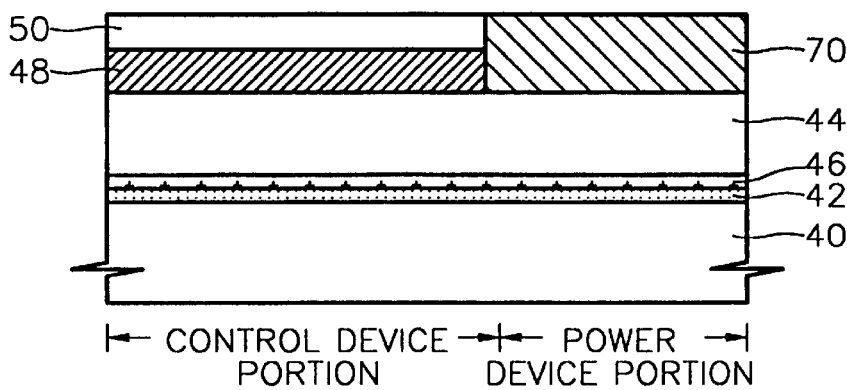
Figure 5C:
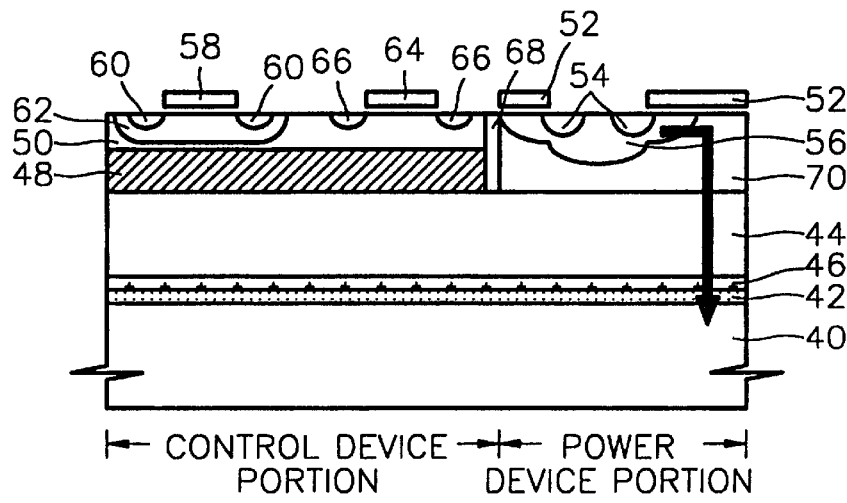

FIGS. 5A through 5C are sectional views illustrating a method for the intelligent power integrated circuit of FIG. 4 using the silicon direct bonding technology.

Referring to FIG. 5A, the process is performed in the same manner as that in the first embodiment, and then an epitaxial layer 70 is grown on the entire surface of the resultant structure by epitaxy technology. At this time, the conductivity type and the concentration of the epitaxial layer 70 are the same as those of the substrate 44 for a power device, and the thickness thereof is obtained by adding the thickness of the insulating layer 48 to the thickness of the substrate 50 for the control device.

Referring to FIG. 5B, planarization is performed until the substrate 50 for the control device is exposed, to minimize the step difference between the control device and the power device portion generated from growth of the epitaxial layer 70. At this time, the planarization method uses plasma etching or chemical mechanical polishing.

Referring to FIG. 5C, a trench is formed between the control device portion and the power device portion, and then the trench is buried with an insulating material to form an isolation layer 68, and further control devices such as the bipolar transistor and/or the MOS transistor are formed on the control device portion, and the power device such as IGBT is formed in the power device portion.

At this time, in order to form the bipolar transistor in the control device portion, as described above, the buried layer is formed before bonding the substrate 50 for a control device to the insulating layer 48. The method for forming a buried layer is the same as the first embodiment.

According to the intelligent power integrated circuit and the method for manufacturing the same of the present invention, buffer layers are formed for the IGBT device having characteristics of the fast switching speed and the low on-state voltage drop, so that power consumption due to the switching loss and the conduction loss can be minimized, to thereby maximize device performance of the intelligent power integrated circuit. Also, the control device portion is formed on the SOI substrate so that the multiple function device such as the bipolar transistor or the MOS transistor can be manufactured on the substrate for a control device. Further, the power device portion can be formed of the IGBT device, which enables high impedance to be input.

It should be understood that the invention is not limited to the illustrated embodiment and that many changes and modifications can be made within the scope of the invention by a person skilled in the art.

What is claimed is:

1. An intelligent power integrated circuit comprising:
   a handling substrate of a first conductivity type of a first concentration;
   a substrate for a power device of a second conductivity type of a second concentration lower than that of the first concentration, the substrate for a power device having a first buffer layer of a third concentration higher than that of the second concentration formed around a surface between the handling substrate and the substrate for a power device, wherein the handling substrate has a second buffer layer of a fourth concentration higher than that of the first concentration around the surface between the handling substrate and the substrate for a power device;
   a substrate for a control device formed on an insulating layer partially formed on the substrate for a power device; and
   a control device formed on the substrate for a control device, and a power device vertically formed through the substrate for a power device and the handling substrate.

2. The intelligent power integrated circuit of claim 1, wherein the handling substrate is composed of a P$^+$-type semiconductor material, the substrate for a power device is composed of an N$^-$-type semiconductor material, the first buffer layer is composed of an N$^+$-type semiconductor material, and the second buffer layer is composed of a P$^{++}$-type semiconductor material.

3. The intelligent power integrated circuit of claim 1, wherein the substrate for a control device is doped with an impurity of the first conductivity type or the second conductivity type.

4. The intelligent power integrated circuit of claim 1, further comprising an insulating wall formed on the side wall of the substrate for a control device for preventing a power device formed on the substrate for a power device from being electrically connected to a control device formed in the substrate for a control device.

5. The intelligent power integrated circuit of claim 1, wherein the power device vertically formed through the substrate for a power device and the handling substrate is an insulated gate bipolar transistor (IGBT).

6. The intelligent power integrated circuit of claim 1, wherein the control device formed on the substrate for a control device is a Complementary Metal-Oxide Semiconductor (CMOS).

7. The intelligent power integrated circuit of claim 1, wherein the substrate for a control device is composed from a P-type semiconductor.

8. An intelligent power integrated circuit comprising:
   a handling substrate of a first conductivity type of a first concentration;
   a substrate for a power device of a second conductivity type of a second concentration lower than that of the first concentration, the substrate for a power device having a first buffer layer of a third concentration higher than that of the second concentration formed around a surface between the handling substrate and the substrate for a power device, wherein the handling substrate has a second buffer layer of a fourth concentration higher than that of the first concentration around the surface between the handling substrate and the substrate for a power device;
   a substrate for a control device formed on an insulating layer formed on a control device portion of the substrate for a power device;
   an epitaxial layer formed on the power device portion of the substrate for a power device, electrically isolated from the substrate for a control device by an isolation layer; and
   a control device formed on the substrate for a control device and a power device vertically formed through the epitaxial layer, the substrate for a power device and the handling substrate.

9. The intelligent power integrated circuit of claim 8, wherein the substrate for a control device is composed from a P-type semiconductor.

10. The intelligent power integrated circuit of claim 8, wherein the epitaxial layer is of the second conductivity type.

11. The intelligent power integrated circuit of claim 8, wherein the epitaxial layer is composed of a N-type semiconductor.

12. The intelligent power integrated circuit of claim 8, wherein the control device formed on the substrate for a control device is a Complementary Metal-Oxide Semiconductor (CMOS).

13. The intelligent power integrated circuit of claim 8, wherein the handling substrate is composed of a P$^+$-type semiconductor material, the substrate for a power device is composed of an N$^-$-type semiconductor material the first buffer layer is composed of an N$^+$-type semiconductor material, and the second buffer layer is composed of a P$^{++}$-type semiconductor material.

14. The intelligent power integrated circuit of claim 13, wherein the substrate for a control device is doped with an impurity of the first conductivity or the second conductivity type.

15. The intelligent power integrated circuit of claim 12, wherein the power device vertically formed through the substrate for a power device and the handling substrate is an insulated gate bipolar transistor (IGBT) device.

16. An intelligent power integrated circuit comprising:
   a handling substrate of a first conductivity type of a first concentration;

a substrate for a power device of a second conductivity type of a second concentration lower than that of the first concentration, the substrate for a power device having a first buffer layer of a third concentration higher than that of the second concentration formed around a surface between the handling substrate and the substrate for a power device;

a substrate for a control device formed on an insulating layer partially formed on the substrate for a power device; and a control device formed on the substrate for a control device, and a power device vertically formed through the substrate for a power device and the handling substrate, wherein the control device formed on the substrate for a control device is a Complementary Metal-Oxide Semiconductor (CMOS); and wherein the handling substrate has a second buffer layer of a fourth concentration higher than that of the first concentration around the surface between the handling substrate and the substrate for a power device.

17. The intelligent power integrated circuit of claim 16, wherein the handling substrate is composed of a $P^+$-type semiconductor material, the substrate for a power device is composed of an $N^-$-type semiconductor material, the first buffer layer is composed of an $N^+$-type semiconductor material, and the second buffer layer is composed of a $P^{++}$-type semiconductor material.

18. The intelligent power integrated circuit of claim 16, wherein the substrate for a control device is doped with an impurity of the first conductivity type or the second conductivity type.

19. The intelligent power integrated circuit of claim 16, further comprising an insulating wall formed on the side wall of the substrate for a control device for preventing a power device formed on the substrate for a power device from being electrically connected to a control device formed in the substrate for a control device.

20. The intelligent power integrated circuit of claim 16, wherein the power device vertically formed through the substrate for a power device and the handling substrate is an insulated gate bipolar transistor (IGBT).

21. The intelligent power integrated circuit of claim 16, wherein the substrate for a control device is composed from a P-type semiconductor.

22. The intelligent power integrated circuit of claim 16, further comprising an epitaxial layer formed on the power device portion of the substrate for a power device, electrically isolated from the substrate for a control device by an isolation layer.

23. The intelligent power integrated circuit of claim 22, wherein the epitaxial layer is of the second conductivity type.

24. The intelligent power integrated circuit of claim 22, wherein the epitaxial layer is composed of a N-type semiconductor.

* * * * *